(12) United States Patent
Darling et al.

(10) Patent No.: US 11,351,478 B2
(45) Date of Patent: Jun. 7, 2022

(54) OIL SKIMMER WITH OLEOPHILIC COATING

(71) Applicant: UCHICAGO ARGONNE LLC, Chicago, IL (US)

(72) Inventors: Seth B. Darling, Chicago, IL (US); Jeffrey W. Elam, Elmhurst, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 16/123,382

(22) Filed: Sep. 6, 2018

(65) Prior Publication Data
US 2020/0078705 A1 Mar. 12, 2020

(51) Int. Cl.
*B01D 17/02* (2006.01)
*C02F 1/40* (2006.01)
(Continued)

(52) U.S. Cl.
CPC .......... *B01D 17/0202* (2013.01); *C02F 1/288* (2013.01); *C02F 1/40* (2013.01);
(Continued)

(58) Field of Classification Search
CPC ...... B01D 17/0202; C02F 1/285; C02F 1/288; C02F 1/40; C02F 2101/32;
(Continued)

(56) References Cited

U.S. PATENT DOCUMENTS 3,617,552 A * 11/1971 Will ...................... E02B 15/104
210/649
4,744,889 A 5/1988 Kruyer
(Continued)

FOREIGN PATENT DOCUMENTS

WO   WO-2006/033924        3/2006
WO   WO2011/138583 A1 * 11/2011 ............. E02B 15/04
WO   WO-2015/076438 A1   5/2015

OTHER PUBLICATIONS

Non-Final Office Action on U.S. Appl. No. 15/644,569 dated Jan. 11, 2019.
(Continued)

*Primary Examiner* — Dirk R Bass
(74) *Attorney, Agent, or Firm* — Foley & Lardner LLP

(57) ABSTRACT

A method of fabricating an coating includes providing a coating comprising a base material. The base material is coated with an inorganic material using at least one of an atomic layer deposition (ALD), a molecular layer deposition (MLD), or sequential infiltration synthesis (SIS) process. The SIS process includes at least one cycle of exposing the coating to a first metal precursor for a first predetermined time and a first partial pressure. The first metal precursor infiltrates at least a portion of the base material and binds with the base material. The coating is exposed to a second co-reactant precursor for a second predetermined time and a second partial pressure. The second co-reactant precursor reacts with the first metal precursor, thereby forming the inorganic material on the base material. The inorganic material infiltrating at least the portion of the base material. The inorganic material is functionalized with a material.

7 Claims, 5 Drawing Sheets

(51) Int. Cl.

| | |
|---|---|
| C02F 1/28 | (2006.01) |
| C23C 16/455 | (2006.01) |
| E02B 15/04 | (2006.01) |
| E02B 15/10 | (2006.01) |
| C02F 101/32 | (2006.01) |
| C02F 103/00 | (2006.01) |

(52) U.S. Cl.
CPC ...... *C23C 16/45525* (2013.01); *E02B 15/045* (2013.01); *E02B 15/10* (2013.01); *C02F 1/285* (2013.01); *C02F 2101/32* (2013.01); *C02F 2103/007* (2013.01); *E02B 15/102* (2013.01); *E02B 15/104* (2013.01)

(58) Field of Classification Search
CPC ......... C02F 2103/007; C23C 16/45525; E02B 15/045; E02B 15/10; E02B 15/102; E02B 15/104; Y02W 10/37
See application file for complete search history.

(56) References Cited

U.S. PATENT DOCUMENTS

| | | | |
|---|---|---|---|
| 4,889,542 A | 12/1989 | Hayes | |
| 5,133,881 A | 7/1992 | Miller et al. | |
| 5,645,733 A * | 7/1997 | Hobson | B01D 17/005 210/776 |
| 5,973,068 A * | 10/1999 | Yamaya | C09D 183/04 524/865 |
| 6,326,326 B1 * | 12/2001 | Feng | B01J 20/0211 423/701 |
| 6,723,595 B2 | 4/2004 | Park | |
| 8,980,418 B2 | 3/2015 | Darling et al. | |
| 9,103,086 B2 | 8/2015 | Cantrell et al. | |
| 9,719,226 B2 | 8/2017 | Riedel | |
| 2002/0005360 A1 | 1/2002 | Haug et al. | |
| 2002/0043216 A1 | 4/2002 | Hwang et al. | |
| 2002/0144595 A1 | 10/2002 | Wang et al. | |
| 2003/0082412 A1 | 5/2003 | Fukuda et al. | |
| 2005/0081907 A1 | 4/2005 | Lewis et al. | |
| 2006/0048938 A1 | 3/2006 | Kalman | |
| 2006/0088666 A1 | 4/2006 | Kobrin et al. | |
| 2008/0073288 A1 | 3/2008 | Fan et al. | |
| 2008/0107809 A1 | 5/2008 | Wu et al. | |
| 2009/0111703 A1 * | 4/2009 | Gopalan | C40B 40/04 506/9 |
| 2009/0297868 A1 | 12/2009 | Ito et al. | |
| 2009/0304920 A1 | 12/2009 | Elam et al. | |
| 2010/0003406 A1 | 1/2010 | Lam et al. | |
| 2010/0080903 A1 * | 4/2010 | Tamitsuji | B05D 1/60 427/255.11 |
| 2011/0042301 A1 | 2/2011 | Zhang et al. | |
| 2011/0056886 A1 | 3/2011 | De Luca | |
| 2011/0168454 A1 | 7/2011 | Keshavan et al. | |
| 2012/0046421 A1 | 2/2012 | Darling et al. | |
| 2012/0171403 A1 | 7/2012 | Dodge | |
| 2013/0059123 A1 | 3/2013 | Wang et al. | |
| 2013/0095996 A1 | 4/2013 | Buelow et al. | |
| 2014/0370259 A1 | 12/2014 | Edwards et al. | |
| 2014/0371060 A1 | 12/2014 | Smith et al. | |
| 2017/0025658 A1 | 1/2017 | Shi et al. | |
| 2017/0157534 A1 | 6/2017 | Curtis et al. | |
| 2017/0166456 A1 * | 6/2017 | Darling | B01J 20/3212 |
| 2017/0304778 A1 | 10/2017 | Ye et al. | |
| 2020/0062600 A1 | 2/2020 | Kidambi et al. | |

OTHER PUBLICATIONS

Barry, E., et al., "Advanced oil sorbents using sequential infiltration synthesis", Jan. 11, 2017, J. Mater. Chem. A, 5(6):2929-2935, abstract.

Calcagnile, P., et al., "Magnetically Driven Floating Foams for the Removal of Oil Contaminants from Water", ACS Nano, May 11, 2012, 6(6):5413-5419.

Ge, J., et al., "Pumping through Porous Hydrophobic/Oleophilic Materials: An Alternative Technology for Oil Spill Remediation", Angew. Chem. Int. Ed., Mar. 3, 2014, 53:3612-3616.

International Search Report and Written Opinion in PCT/US2017/041223, dated Sep. 28, 2017, 8 pages.

Keshavarz, A., et al., "Enhancing oil removal from water by immobilizing multi-wall carbon nanotubes on the surface of polyurethane foam", Journal of Environmental Management, Apr. 24, 2015, 157:279-286.

Wang, Q., et al., "Extremely Efficient and Recyclable Absorbents for Oily Pollutants Enabled by Ultrathin-Layered Functionalization", ACS Appl. Mater. Interfaces, Oct. 15, 2014, 6:18816-18823.

"Oleo Sponge," Argonne National Laboratory, 1 page (2018).

Bico, et al., "Wetting of textured surfaces," Colloids and Surfaces A: Physicochemical and Engineering Aspects 206(1-3), pp. 41-46 (2002).

Bobji, et al., "Underwater sustainability of the 'Cassie' state of wetting," Langmuir 25(20), pp. 12120-12126 (2009).

Buluswar, et al., "50 Breakthroughs: Critical scientific and technological advances needed for sustainable global development," Institute for Transformative Technologies, Lawrence Berkeley National Lab., 22 pages (2014).

Cao, et al., "Hydrophobic/Hydrophilic Cooperative Janus System for Enhancement of Fog Collection," Small 11(34), pp. 4379-4384 (2015).

Chen & Xu, "Mineral-Coated Polymer Membranes with Superhydrophilicity and Underwater Superoleophobicity for Effective Oil/Water Separation," Scientific Reports 3, 2776, 6 pages (2013).

Chen, et al., "Bio-inspired $CaCO_3$ coating for superhydrophilic hybrid membranes with high water permeability," Journal of Materials Chemistry 22, pp. 22727-22733 (2012).

Chen, et al., "Enhancing the hydrophilicity and water permeability of polypropylene membranes by nitric acid activation and metal oxide deposition," Journal of Membrane Science 487, pp. 109-116 (2015).

Cheryan & Rajagopalan, "Membrane processing of oily streams. Wastewater treatment and waste reduction," Journal of Membrane Science 151(1), pp. 13-28 (1998).

Choi, et al., "Effects of substrate conductivity on cell morphogenesis and proliferation using tailored, atomic layer deposition-grown ZnO thin films," Scientific Reports 5, 9974, 9 pages (2015).

Dillon, et al., "Surface chemistry of $Al_2O_3$ deposition using $Al(CH_3)_3$ and $H_2O$ in a binary reaction sequence," Surface Science 322 (1-3), pp. 230-242 (1995).

Dorrer & Ruhe, "Superaerophobicity: Repellence of air bubbles from submerged, surface-engineered silicon substrates," Langmuir 28(42), pp. 14968-14973 (2012).

Dudchenko, et al., "Coupling Underwater Superoleophobic Membranes with Magnetic Pickering Emulsions for Fouling-Free Separation of Crude Oil/Water Mixtures: An Experimental and Theoretical Study," ACS Nano 9(10), pp. 9930-9941 (2015).

Elam, et al., "Conformal coating on ultrahigh-aspect-ratio nanopores of anodic alumina by atomic layer deposition," Chemistry of Materials 15(18), pp. 3507-3517 (2003).

Elam, et al., "Spatially controlled atomic layer deposition in porous materials," Applied Physics Letters 91, pp. 177-184 (2007).

Fabreguette, et al., "Quartz crystal microbalance study of tungsten atomic layer deposition using $WF_6$ and $Si_2H_6$," Thin Solid Films 488(1-2), pp. 103-110 (2005).

Fakhru'l-Razi, et al., "Review of technologies for oil and gas produced water treatment," Journal of Hazardous Materials 170(2-3), pp. 530-551 (2009).

Frackowiak & Beguin, "Carbon materials for the electrochemical storage of energy in capacitors," Carbon 39(6), pp. 937-950 (2011).

Gao, et al., "A Robust Polyionized Hydrogel with an Unprecedented Underwater Anti-Crude-Oil-Adhesion Property," Advanced Materials 28(26), pp. 5307-5314 (2016).

George, "Atomic layer deposition: an overview," Chemical Reviews 110(1), pp. 111-131 (2010).

Guo, et al., "Robust Underwater Oil-Repellent Material Inspired by Columnar Nacre," Advanced Materials 28(38), pp. 8505-8510 (2016).

(56) References Cited

OTHER PUBLICATIONS

Hall, et al., "Energy storage in electrochemical capacitors: designing functional materials to improve performance," Energy & Environmental Science 3, pp. 1238-1251 (2010).
Hao, et al., "Oxygen Vacancies Lead to Loss of Domain Order, Particle Fracture, and Rapid Capacity Fade in Lithium Manganospinel ($LiMn_2O_4$) Batteries," ACS Applied Materials & Interfaces 6(14), pp. 10849-10857 (2014).
Hou, et al., "Biocatalytic Janus membranes for $CO_2$ removal utilizing carbonic anhydrase," Journal of Materials Chemistry A 3, pp. 17032-17041 (2015).
Hu, et al,. "An ultrathin bilayer membrane with asymmetric wettability for pressure responsive oil/water emulsion separation," J. Mater. Chem. A, 3, pp. 23477-23482 (2015).
Huang & Wang, "A Simple Nanocellulose Coating for Self-Cleaning upon Water Action: Molecular Design of Stable Surface Hydrophilicity," Angewandte Chemie International Edition 56(31), pp. 9053-9057 (2017).
Huang, et al., "Novel Janus Membrane for Membrane Distillation with Simultaneous Fouling and Wetting Resistance," Environmental Sciences Technology 51(22), pp. 13304-13310 (2017).
Janotti & Van De Walle, "Fundamentals of zinc oxide as a semiconductor," Reports on Progress in Physics 72(12), 29 pages (2009).
Jung, et al., "Improved functionality of lithium-ion batteries enabled by atomic layer deposition on the porous microstructure of polymer separators and coating electrodes," Advanced Energy Materials 2(8), pp. 1022-1027 (2012).
Jur, et al., "Temperature-dependent subsurface growth during atomic layer deposition on polypropylene and cellulose fibers," Langmuir 26(11), pp. 8239-8244 (2010).
Kim, et al., "A development of high power activated carbon using the KOH activation of soft carbon series cokes," Transactions on Electrical and Electronic Materials 15(2), pp. 81-86 (2014).
Kota, et al., "Hygro-responsive membranes for effective oil-water separation," Nature Communications 3, 1025, 8 pages (2012).
Kota, et al., "The design and applications of superomniphobic surfaces," NPG Asia Materials 6, e109, 16 pages (2014).
Lam, et al., "A Chemically Patterned Microfluidic Paper-based Analytical Device (C-uPAD) for Point-of-Care Diagnostics," Scientific Reports 7, 1188, 10 pages (2017).
Lee, et al., "An Alternative Route Towards Metal-Polymer Hybrid Materials Prepared by Vapor-Phase Processing," Advanced Functional Materials 21(16), pp. 3047-3055 (2011).
Lee, et al., "Conformal Nitrogen-Doped $TiO_2$ Photocatalytic Coatings for Sunlight-Activated Membranes," Advanced Sustainable Systems 1(1-2), 1600041, 23 pages (2017).
Lee, et al., "Membrane materials for water purification: design, development, and application," Environmental Science: Water Research & Technology 2, pp. 17-42 (2016).
Lee, et al., "Nanofluidic transport governed by the liquid/vapour interface," Nature Nanotechnology 9, pp. 317-323 (2014).
Li, et al., "Modification of ceramic membranes for pore structure tailoring: The atomic layer deposition route," Journal of Membrane Science 397-398, pp. 17-23 (2012).
Li, et al., "Precise pore size tuning and surface modifications of polymeric membranes using the atomic layer deposition technique," Journal of Membrane Science 385-386, pp. 1-9 (2011).
Li, et al., "Under-Water Superaerophobic Pine-Shaped Pt Nanoarray Electrode for Ultrahigh-Performance Hydrogen Evolution," Advanced Functional Materials 25(11), pp. 1737-1744 (2015).
Liu, et al., "Clam's Shell Inspired High-Energy Inorganic Coatings with Underwater Low Adhesive Superoleophobicity," Advanced Materials 24(25), pp. 3401-3405 (2012).
MacDiarmid, et al., "Polyaniline: a new concept in conducting polymers," Synthetic Metals 18(1-3), pp. 285-290 (1987).
McNeill, et al., "Electronic Conduction in Polymers. I. The Chemical Structure of Polypyrrole," Australian Journal of Chemistry 16(6), pp. 1056-1075 (1963).
Naveen, et al., "Applications of conducting polymer composites to electrochemical sensors: A review," Applied Materials Today 9, pp. 419-433 (2017).
Oh, et al., "Janus-Faced, Dual-Conductive/Chemically Active Battery Separator Membranes," Advanced Functional Materials 26(39), pp. 7074-7083 (2016).
Ozkaya, et al., "Combined in situ XPS and UHV-chemical force microscopy (CFM) studies of the plasma induced surface oxidation of polypropylene," Plasma Processes and Polymers 11(3), pp. 256-262 (2014).
Parsons, et al., "Mechanisms and reactions during atomic layer deposition on polymers," Coordination Chemistry Reviews 257 (23-24), pp. 3323-3331 (2013).
Pasta, et al., "A Desalination Battery," Nano Letters 12(2), pp. 839-843 (2012).
Peng, et al., "Janus separator of polypropylene-supported cellular graphene framework for sulfur cathodes with high utilization in lithium-sulfur batteries," Advanced Science 3(1), pp. 1-11 (2015).
Peng, et al., "Theoretical specific capacitance based on charge storage mechanisms of conducting polymers: Comment on 'Vertically oriented arrays of polyaniline nanorods and their super electrochemical properties'," Chemical Communications 47, pp. 4105-4107 (2011).
Pi, et al., "Polypropylene microfiltration membranes modified with $TiO_2$ nanoparticles for surface wettability and antifouling property," Journal of Membrane Science 500, pp. 8-15 (2016).
Porada, et al., "Review on the science and technology of water desalination by capacitive deionization," Progress in Materials Science 58(8), pp. 1388-1442 (2013).
Remillard, et al., "A direct comparison of flow-by and flow-through capacitive deionization," Desalination 444, pp. 169-177 (2018).
Ren, et al., "A single-layer Janus membrane with dual gradient conical micropore arrays for self-driving fog collection," Journal of Materials Chemistry A 5, pp. 18403-18408 (2017).
Sasaki, et al., "Asymmetric Superhydrophobic/Superhydrophilic Cotton Fabrics Designed by Spraying Polymer and Nanoparticles," ACS Applied Materials & Interfaces 8(1), pp. 651-659 (2016).
Simon & Gogotsi, "Materials for electrochemical capacitors," Nature Materials 7, pp. 845-854 (2008).
Song, et al., "Anomalous Pseudocapacitive Behavior of a Nanostructured, Mixed-Valent Manganese Oxide Film for Electrical Energy Storage," Nano Letters 12(7), pp. 3483-3490 (2012).
Steele, et al., "Inherently Superoleophobic Nanocomposite Coatings by Spray Atomization," Nano Letters 9(1), pp. 501-505 (2009).
Sugimoto, et al., "Charge storage mechanism of nanostructured anhydrous and hydrous ruthenium-based oxides," Electrochimica Acta 52(4), pp. 1742-1748 (2006).
Sugimoto, et al., "Preparation of Ruthenic Acid Nanosheets and Utilization of Its Interlayer Surface for Electrochemical Energy Storage," Angewandte Chemie International Edition 42(34), pp. 4092-4096 (2003).
Suss, et al., "Water desalination via capacitive deionization: what is it and what can we expect from it?," Energy & Environmental Science 8, pp. 2296-2319 (2015).
Tao, et al., "An Intelligent Superwetting PVDF Membrane Showing Switchable Transport Performance for Oil/Water Separation," Advanced Materials 26(18), pp. 2943-2948 (2014).
Tian, et al., "Droplet and Fluid Gating by Biomimetic Janus Membranes," Advanced Functional Materials 24(38), pp. 6023-6028 (2014).
Toupin, et al., "Charge Storage Mechanism of $MnO_2$ Electrode Used in Aqueous Electrochemical Capacitor," Chemistry of Materials 16(16), pp. 3184-3190 (2004).
Ueda, et al., "Effects of aeration on suction pressure in a submerged membrane bioreactor," Water Research 31(3), pp. 489-494 (1997).
Vaha-Nissi, et al., "Growth of thin $Al_2O_3$ films on biaxially oriented polymer films by atomic layer deposition," Thin Solid Films 522, pp. 50-57 (2012).
Wang, et al., "Directional water-transfer through fabrics induced by asymmetric wettability," Journal of Materials Chemistry 20, 7938 (2010).

(56) References Cited

OTHER PUBLICATIONS

Wang, et al., "PVDF membranes with simultaneously enhanced permeability and selectivity by breaking the tradeoff effect via atomic layer deposition of TiO2," Journal of Membrane Science 442, pp. 57-64 (2013).
Wang, et al., "Rapid and Efficient Separation of Oil from Oil-In-Water Emulsions Using a Janus Cotton Fabric," Angewandte Chemie International Edition 55(4), pp. 1291-1294 (2016).
Wang, et al., "Simply realizing 'water diode' Janus membranes for multifunctional smart applications," Materials Horizons 4, pp. 701-708 (2017).
Wang, et al., "Universal Janus Filters for the Rapid Separation of Oil from Emulsions Stabilized by Ionic or Nonionic Surfactants," Angewandte Chemie International Edition 56(42), pp. 12892-12897 (2017).
Wen, et al., "Zeolite-coated mesh film for efficient oil-water separation," Chemical Science 4, pp. 591-595 (2013).
Wu, et al., "Janus Membranes with Opposing Surface Wettability Enabling Oil-to-Water and Water-to-Oil Emulsification," ACS Applied Materials & Interfaces 9(6), pp. 5062-5066 (2017).
Wu, et al., "Unidirectional water-penetration composite fibrous film via electrospinning," Soft Matter 8, 5996 (2012).
Xu, et al., "Atomic layer deposition of alumina on porous polytetrafluoroethylene membranes for enhanced hydrophilicity and separation performances," Journal of Membrane Science 415-416, pp. 435-443 (2012).
Xu, et al., "Hydrophilization of porous polypropylene memoranes by atomic layer deposition of TiO2 for simultaneously improved permeability and selectivity," Journal of Membrane Science 448, pp. 215-222 (2013).
Xue, et al., "A Novel Superhydrophilic and Underwater Superoleophobic Hydrogel-Coated Mesh for Oil/Water Separation," Advanced Materials 23(37), pp. 4270-4273 (2011).
Yang, et al., "Janus hollow fiber membrane with a mussel-inspired coating on the lumen surface for direct contact membrane distillation," Journal of Membrane Science 523, pp. 1-7 (2017).
Yang, et al., "Janus Membranes with Asymmetric Wettability for Fine Bubble Aeration," Advanced Materials Interfaces 3(9), pp. 1-5 (2016).
Yang, et al., "Janus Membranes: Exploring Duality for Advanced Separation," Angewandte Chemie International Edition 55(43), pp. 13398-13407 (2016).
Yang, et al., "Mussel-inspired modification of a polymer membrane for ultra-high water permeability and oil-in-water emulsion separation," Journal of Materials Chemistry A 2, pp. 10225-10230 (2014).
Yang, et al., "Paper-Based Microfluidic Devices: Emerging Themes and Applications," Analytical Chemistry 89(1), pp. 71-91 (2017).

Yang, et al., "Polymer membrane with a mineral coating for enhanced curling resistance and surface wettability," Chemical Communications 51, pp. 12779-12782 (2015).
Yang, et al., "Silica-Decorated Polypropylene Microfiltration Membranes with a Mussel-Inspired Intermediate Layer for Oil-in-Water Emulsion Separation," ACS Applied Materials & Interfaces 6(15), pp. 12566-12572 (2014).
Yang, et al., "Surface and interface engineering for organic-inorganic composite membranes," Journal of Materials Chemistry A 4(25), pp. 9716-9729 (2016).
Zang, et al., "Well-Aligned Cone-Shaped Nanostructure of Polypyrrole/RuO2 and Its Electrochemical Supercapacitor," The Journal of Physical Chemistry C 112(38), pp. 14843-14847 (2008).
Zhang & Barboiu, "Dynameric asymmetric membranes for directional water transport," Chemical Communications 51, pp. 15925-15927 (2015).
Zhang, et al., "Biomimetic multifunctional nanochannels based on the asymmetric wettability of heterogeneous nanowire membranes," Advanced Materials 26(7), pp. 1071-1075 (2014).
Zhang, et al., "Cupric Phosphate Nanosheets-Wrapped Inorganic Membranes with Superhydrophilic and Outstanding Anticrude Oil-Fouling Property for Oil/Water Separation," ACS Nano 12(1), pp. 795-803 (2018).
Zhang, et al., "Mineralized growth of Janus membrane with asymmetric wetting property for fast separation of a trace of blood," Journal of Materials Chemistry B 5, pp. 4876-4882 (2017).
Zhang, et al., "Nanowire-Haired Inorganic Membranes with Superhydrophilicity and Underwater Ultralow Adhesive Superoleophobicity for High-Efficiency Oil/Water Separation," Advanced Materials 25(30), pp. 4192-4198 (2013).
Zhang, et al., "Salt-Induced Fabrication of Superhydrophilic and Underwater Superoleophobic PAA-g-PVDF Membranes for Effective Separation of Oil-in-Water Emulsions," Angewandte Chemie International Edition 53(3), pp. 856-860 (2014).
Zhang, et al., "Superhydrophobic and Superoleophilic PVDF Membranes for Effective Separation of Water-in-Oil Emulsions with High Flux," Advanced Materials 25(14), pp. 2071-2076 (2013).
Zhao, et al., "Directional Fluid Transport in Thin Porous Materials and its Functional Applications," Small 13(4), pp. 1-22 (2017).
Zheng & Yapa, "Bouyant Velocity of Spherical and Nonspherical Bubbles/Droplets," Journal of Hydraulic Engineering 126(11), pp. 852-854 (2000).
Zhou, et al., "Superphobicity/philicity janus fabrics with switchable, spontaneous, directional transport ability to water and oil fluids," Sci. Rep., 3, pp. 1-6 (2013).
Afshar & Cadien, "Growth mechanism of atomic layer deposition of zinc oxide: A density functional theory approach," Applied Physics Letters 103(25), 251906, 6 pages (2013).
Kowalik, et al., "Extra-Low Temperature Growth of ZnO by Atomic Layer Deposition with Diethylzinc Precursor," Acta Physica Polonica A 112(2), pp. 401-406 (2007).

* cited by examiner

OIL SKIMMER WITH OLEOPHILIC COATING

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates generally to oil skimmers with oleophilic coatings and methods of forming the same.

BACKGROUND

Oil spills are a major environmental hazard. Particularly, oil spills in water bodies cause billions of dollars in losses, which includes cost of lost oil, environmental remediation after oil spills, losses to businesses in coastal areas, and legal costs, to name a few. For example, it is estimated that the 1979 Ixtoc 1 oil spill cost about $1.3 billion, the 1989 Exxon Valdez oil spill cost about $6.3 billion, and the most recent Deepwater Horizon oil spill cost over $60 billion. Effective remediation has the potential to dramatically reduce these costs. Various technologies are used for recovering surface oil spills, that is, oil floating on the surface of a water body. These include, for example, skimming (which is a slow and tedious process), burning (which has significant environmental consequences itself), and dispersing using chemical dispersants (which can be toxic to aquatic life and does not directly eliminate the oil but rather causes it to submerge as droplets).

Oil skimmers are used to separate oil floating on a liquid surface in situations such as oil spill response, waste water installations, process fluid removal, wastewater runoff, and industrial installations. Oil skimmers function by using a structure to capture oil, which is then moved to a location for storage so that the oil can be extracted. The oil is typically removed by being skimmed, squeezed or wiped from the surface of the liquid. Current skimmers capture a substantial amount of water, typically the bulk liquid with which the oil is mixed or dispersed on. This results in a larger volume of water/oil material to store and lesser amounts of oil extracted from the environment. There exists a need for a skimmer with improved selectivity for oil to improve the throughput and reduce the amount of water collected with the oil.

SUMMARY

Embodiments described herein relate generally to oil skimmers and methods for coating oil skimmers with an oleophilic coating.

One embodiment relates to an oil skimmer comprising an oil collector having an oleophilic coating on a base substrate, the oleophilic coating comprising a silane compound. The oil skimmer further includes an oil collector retriever, operably connected to the oil collector for movement of the oil collector. An oil extractor is positioned in operative contact with at least a portion of the oil collector. The oil collector retriever is configured to position the portion of the oil collector in communication with the oil extractor, wherein the oil extractor is configured to extract oil from the oleophilic coating. A storage vessel is provided for receiving the extracted oil.

Another embodiment relates to a method of fabricating an oil skimmer, comprising coating a portion of a skimmer collector with an inorganic material using at least one of an atomic layer deposition (ALD), a molecular layer deposition (MLD), or sequential infiltration synthesis (SIS) process. The at least one of the ALD, MLD, or SIS process includes at least one cycle of: exposing the portion of the skimmer collector to a first metal precursor for a first predetermined time and a first partial pressure, the first metal precursor depositing on or infiltrating at least a portion of the base material and binding with the base material, and exposing the portion of the skimmer collector to a second co-reactant precursor for a second predetermined time and a second partial pressure, the second co-reactant precursor reacting with the first metal precursor, thereby forming the inorganic material on the base material, the inorganic material growing on or infiltrating at least the portion of the base material. The method further comprises functionalizing the inorganic material and forming a functionalized portion of the skimmer collector having an higher oleophilicity than prior to coating.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Figure 1:
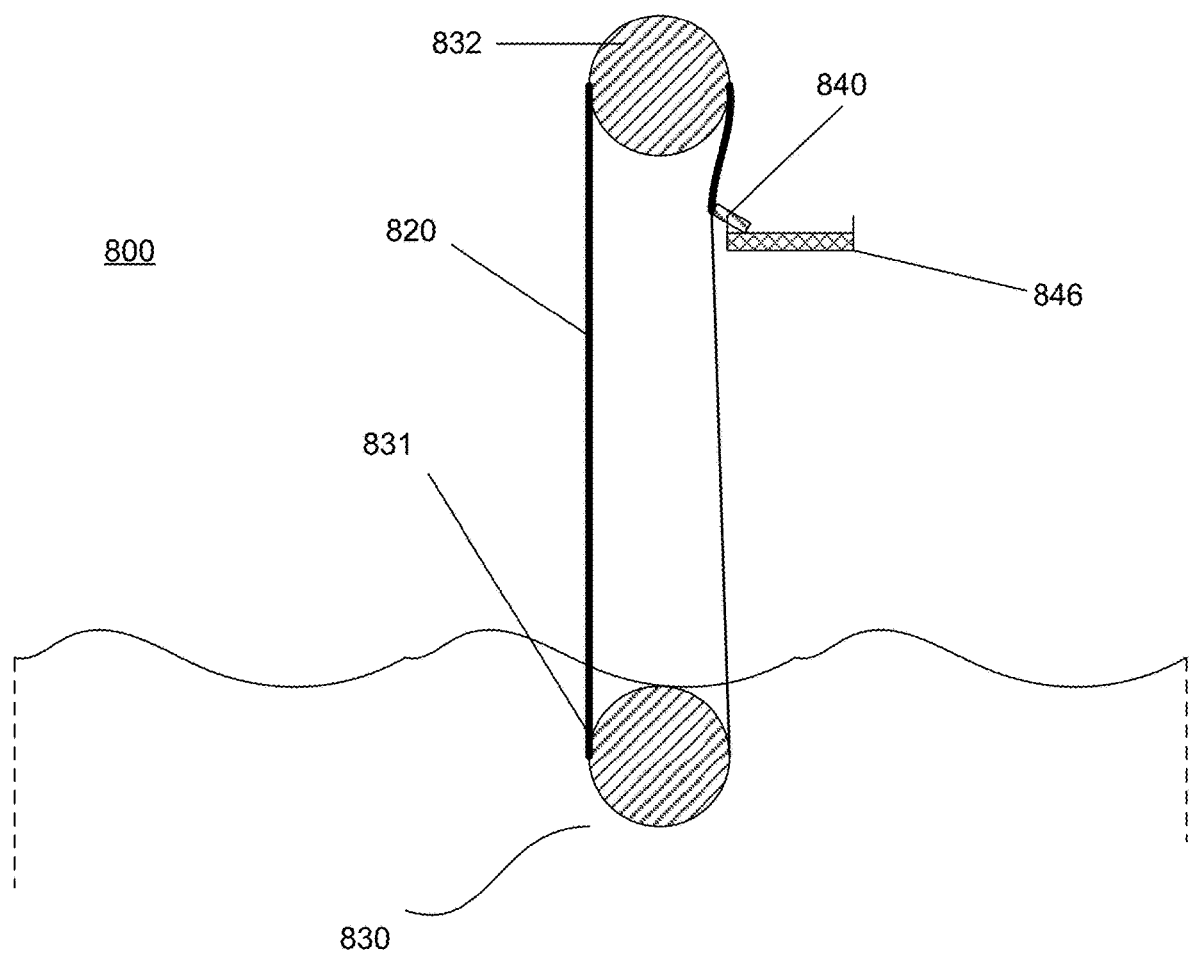
FIG. 1 illustrates an oil skimmer utilizing an oleophilic coating material on a band.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to coatings and methods for forming such coatings and, in particular to forming coatings using an ALD, MLD, and/or SIS process. The coatings are tailored to have a desired affinity, such as for oil, hydrocarbons, organics, groundwater contaminants, biofuel production materials, and constituents of cosmetic or body excretions. In one embodiment, coatings refer to mono-layer or multi-layer coatings (several hundred). In general, a two-step approach is used with a first step to perform ALD/SIS/MLD to create a high density, preferably complete coverage, of binding sites on a substrate. A second step decorates these binding sites with oleophilic molecules, such as through a silanization reaction for example by a vapor phase technique or a solution-based technique.

Oil spills are a major environmental hazard and result in losses of billions of dollars. Particularly there is a dearth of technologies for removing and recovering oil from surface oil spills. Some materials such as silica aerogels, organoclays, zeolites, and carbonaceous materials are sometime used to remove surface and submerged oil. However, these materials have numerous drawbacks. For example, these materials have low absorption capacity, are not reusable, are expensive, and have poor mechanical stability, and the removed oil cannot easily be recovered.

Figure 2:
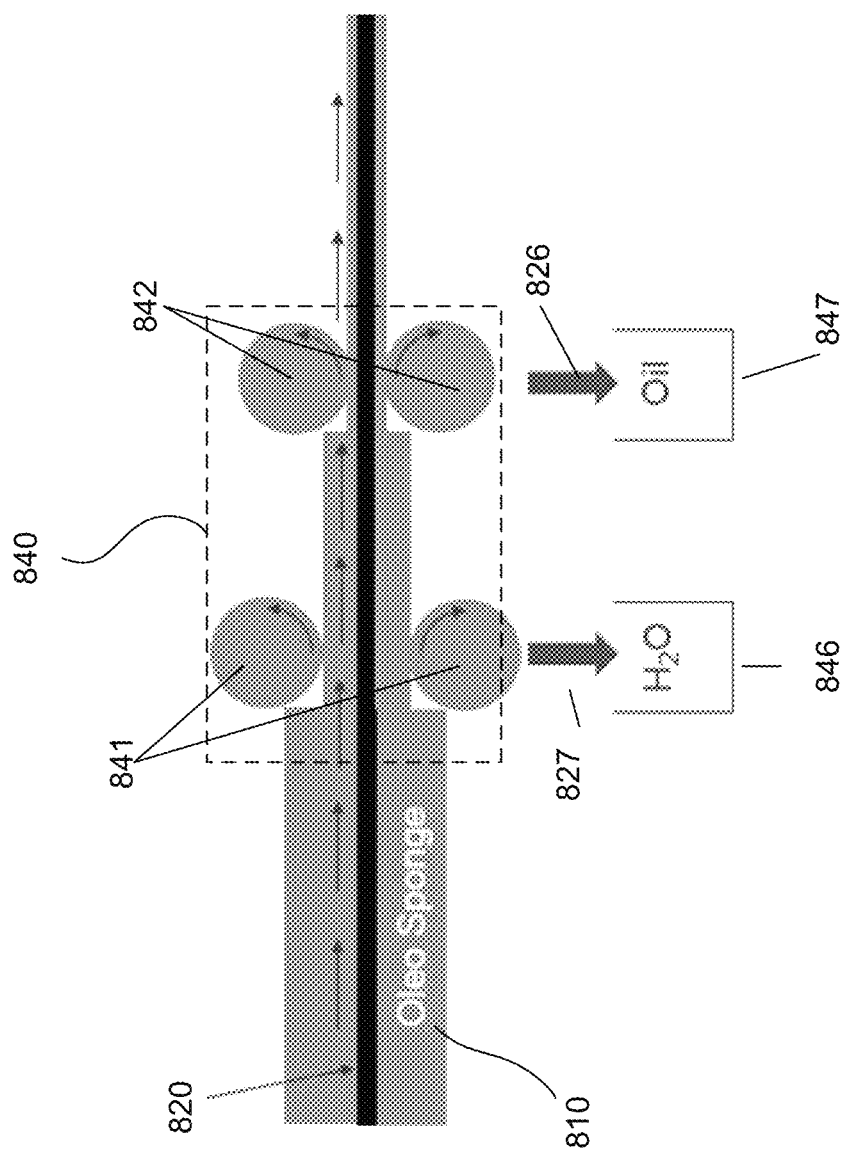
FIG. 2 illustrates an oil skimmer utilizing an oleophilic coating material on a foam substrate.

Described herein are embodiments of a skimmer 800 with an oleophilic coating 810 provided on the skimmer 800, as shown in FIGS. 1 and 2. The skimmer 800 is described first, and then the coating 810 is described further with reference to the structure of the skimmer 800. The skimmer 800 may be a physical skimmer or scraper, such as for removing all or a portion of one material from another. For example, the skimmer 800 may be an oil skimmer for removing oil from the surface of water or a solid. Oil skimmers include, but are not limited to belt skimmers, disk skimmers, drum/barrel styles, mop skimmers, and tube skimmers. Oil skimmers may utilize different materials for the underling substrate that is exposed to the oil, for example metal or a polymer. For metallic substrates, ALD is the preferred deposition mechanism. For polymer substrates, ALD or SIS are the preferred techniques, with SIS allowing for an infusion into the polymer.

A skimmer 800 typically consists of a movable oil collector 820. For example, the oil collector 820 may be a belt, disk, rope, net, mop, etc. The oil collector 820 includes a functionalized coating 810, such as is further described below. The oil collector 820 is connected to an oil collector retriever 830, which functions to provide a motive force to the oil collector 820 via, for example, a rotating axle, winding arm, etc. The retriever 830 is positioned to place the collector 820 in fluid communication with one or more storage vessels 846/847. The collector 820 may be an extended or continuous structure such that not all of the collector 820 is in communication with the vessels 846/847 at one time, rather only a portion of the collector 820 is engaged with the storage vessels 846/847. For example, a band, length of wire or rope may be used where a portion is place in communication with the storage vessel 846/847 at any given time. When in operation, the retriever 830 moves the collector 820 such that the portion of the collector 820 engaged with the storage vessel 846 changes, such as by rotating a disk or looping an extended hoop of wire.

An oil extractor 840 may be positioned in communication with the oil collector 820. For example, the oil extractor 840 may be positioned in communication with the portion of the collector 820 that is engaged with the storage vessel 847 for extracting oil from the coating 810 and oil collector 820, generally. In particular, for some embodiments the coating 810 is disposed on a metal or plastic substrate. It should be appreciated that ALD may be the preferred deposition choice, particularly where the material serving as the substrate is metal. The type of oil extractor 840 utilized may vary depending on the type of skimmer 800. For example, where the coating 810 is a thin layer, such as on a metal surface or a polymer, the oil extractor 840 may comprise a wiper or scrapper that skims or scrapes the oil from the surface of the collector 820, such as a band as shown in FIG. 1. Alternatively, the collector 820 may comprise a sponge-like material having the oleophilic coating 810, where the collector 820 may be squeezed or compressed to extract fluids, as shown in FIG. 2.

Oil skimmers 800 utilizing the oleophilic coating 810 may have the beneficial attribute of shedding water as the oil extractor is removed from the water/oil. For example, in the embodiment shown in FIG. 1, water that has associated with or is physically engaged with the collector (belt) 820 will, at least partially, shed as the respective portion of the collector 820 is removed from the water/oil. In this case, it may be advantageous to tilt the collector 820 below the 90 degree angle shown in FIG. 1 so that the shed water drips off and away from the collector rather than running down the collector. Thus, for embodiments such as in FIGS. 1 and 2, the collector 820 may be tilted to allow water to drip off, away from the collector 820. Further, the coating 810 may be hydrophobic, such as the example coatings described herein, further encouraging the shedding of water as the collector 820 is removed from the water/oil.

FIG. 1 shows a belt skimmer type oil skimmer 800. The oil collector 820 is a belt comprised of metal, fabric, plastic, or some other material with suitable flexibility with the oleophilic coating 810 applied thereto, as described herein. The belt/oil collector 820 is partially submerged in the oil/water and includes a pair of pulleys or axles functioning as the retriever 830. For example, a first pulley 831 may be free rotating and a second pulley 832 may be connected to a drive axle, such as one driven to rotate by a motor (not shown). The belt thus travels up from the oil/water, gathering oil on the belt as the oleophilic coating 810 engages with the oil in the oil/water. As the belt passes the extractor 840, the oil is removed from the coating 810 (and the oil collector 820). Preferably, the removed oil (or oil and water) is captured in the storage container 846. The portion of the belt returning towards the oil/water (see FIG. 1) has had the oil removed and has capacity to again engage oil. The operation of such a device allows for continuous operation and remove of oil.

FIG. 2 illustrates an embodiment utilizing a sponge-like collector 820. Rather than utilizing the skimmer or scrapper of FIG. 1, the sponge-like collector 820 may be squeezed to extract oil (or oil/water). The sponge-like collector 820 may consist of a belt made of a flexible material (such as plastic, metal, rubber, or fabric), where the sponge material, such as polyurethane foam, is attached to the belt using adhesive. The extractor 840 may be positioned in communication with the collector 820 such that a portion of the collector 820 engages with the extractor 840 prior to the portion engaging with the storage vessel 847 to extract oil. For example, FIG.

2 illustrates a first set of rollers 841 that engage with the coating 810 of the collector 820 to extract water 827 to a water collection vessel 846. A second set of rollers 842 are positioned as part of the extractor 840 to further engage with the coating 810 and the collector 820, generally, for the extraction of oil 826 to an oil storage vessel 847. The extraction mechanism may include physical and/or chemical interaction with the collector to facilitate release of oil and/or water from the collector. In one embodiment, the retriever 830 and the extractor 840 may be the same component or part of the same structure, such as a set of rollers that both move the collector 820 and function to extract oil from the collector 820. The sponge-like collector 820 may be better suited for lower viscosity oils compared to conventional disc or drum skimmers. For these conventional skimmers, the oil will form a coating of only ~1 thick, and this will dictate the quantity of oil removed per unit surface area of the skimmer. Moreover, this thickness will decrease with decreasing viscosity. In contrast, the quantity of oil removed for the sponge-like skimmer 820 will scale with the thickness of the foam, and this can be several centimeters in thickness. For highly porous foams, nearly the entire volume of the sponge-like skimmer 820 can be saturated with oil, leading to much higher oil removal rates compared to the conventional skimmer.

With regard to the oleophilic coating 810, in a first step, the surface of the skimmer 800 is functionalized with chemical functional groups such as hydroxyl groups or other chemical moieties selected to promote facile reaction with the subsequent silane agent. Specifically, the collector or a portion of the collector (such as a disk, rope, wire, etc.) is functionalized. These functional groups serve as the chemical attachment location for additional of further groups in subsequent steps. It should be appreciated that the density of functional group binding on the skimmer will be correlated with the density of additional groups (e.g., hydrophobic molecules) bound in subsequent steps. Functional groups can include hyroxyl and bridge bonded oxygen (e.g., M-O-M) species on metal oxide coatings, thiols on metal sulfides, and amines on metal nitrides. The target density of functional groups may be approximately one complete monolayer, or approximately $1\times10^{15}$ molecules per $cm^2$.

In a second step, the functionalized skimmer is exposed to a silane-based molecule. The silane molecule has a structure to enable covalent binding of the molecule to the functional group. For instance, the silane molecule can have Si—Cl bonds that react efficiently with surface hydroxyl groups to form strong, Si—O bonds and releasing HCl. The silane bond provides a strong bond sufficient to resist the mechanical removal of oil as described above as well as the chemical environment for the oil removal. In one particular embodiment, the silane molecules are selected from the group consisting of (3-aminopropyl)triethoxysilane (APTS) or butyldimethyl(dimethyamino)silane (BDMS).

Figure 3:
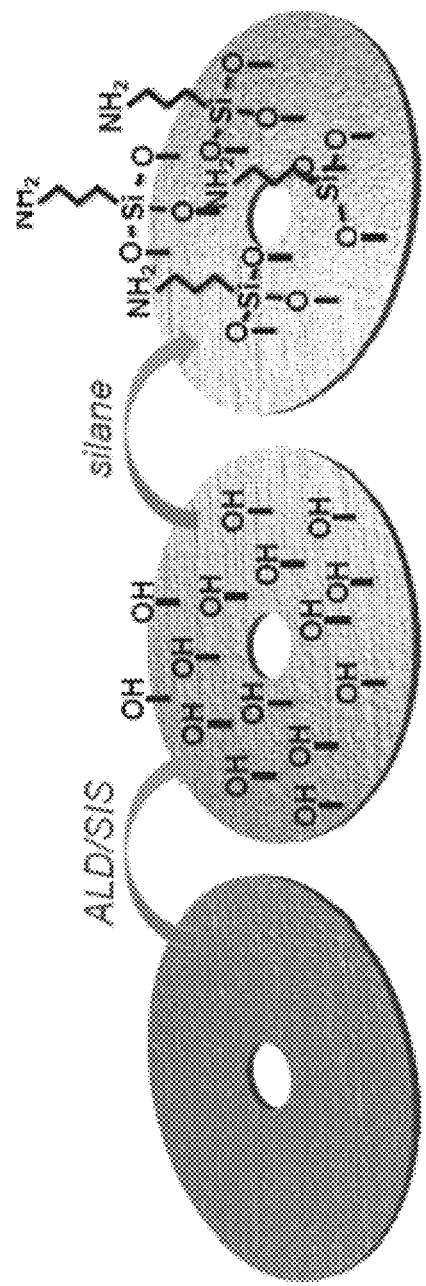
FIG. 3 is an illustration of one process of creating a functionalized oleophilic coating on a substrate.
Figure 4:
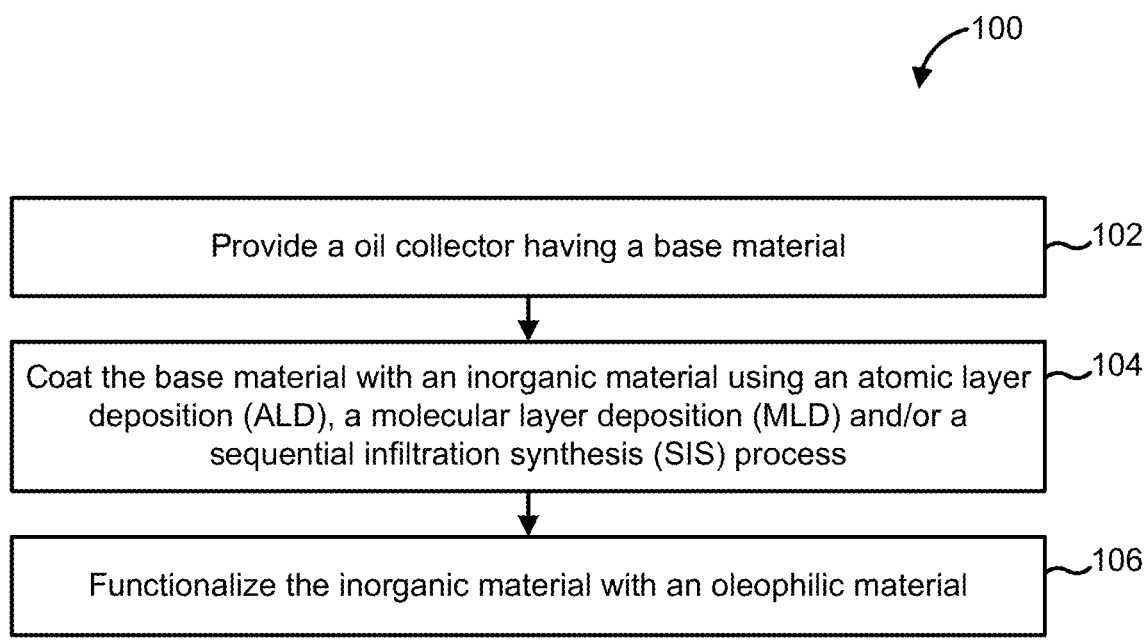
FIG. 4 is a schematic flow diagram of another embodiment of a method for removing oil from an oil spill using an oil skimmer.

FIG. 3 is a diagrammatic representation of a process for creating the coating. FIG. 4 is a schematic flow diagram of a method 100 for forming an oleophilic coating according to an embodiment. The oleophilic coating formed using the method 100 can be used for collecting and recovering oil from oil spills, for example surface oil spills.

The method 100 includes providing an oil collecting having a base material at 102. The base material can include any suitable material such as metal, steel, stainless steel, polymers, or fabrics.

The base material is coated with an inorganic or organic-inorganic hybrid material using an ALD, MLD, and/or SIS process at 104. The ALD, MLD, and/or SIS process may include exposing the base material to a first metal precursor for a first predetermined time and a first partial pressure of the first metal precursor so that the metal precursor deposits on, coats or infiltrates at least a portion of the base material and binds with the base material. The first predetermined time can be in the range of 1 second to 500 seconds (e.g., 1, 5, 10, 20, 30, 40, 50, 60, 70, 80, 90, 100, 120, 140, 160, 180, 200, 220, 240, 260, 280, 300, 350, 400, 450 or 500 seconds inclusive of all ranges and values therebetween). In some embodiments, the first predetermined time is in the range of 1 and 10 seconds, for example about 5 seconds. The first partial pressure of the first metal precursor can be in the range of 0.01 Torr to 10 Torr. (e.g., 0.01, 0.05, 0.1, 0.5, 1.0, 5.0, 10 Torr inclusive of all ranges and values therebetween). In some embodiments, the first partial pressure of the first metal precursor is in the range of 0.1 Torr and 1 Torr, for example about 0.5 Torr. In general, longer exposure times an higher precursor pressures are used to coat porous collector materials such as foams and fabrics to allow for diffusion of gaseous precursors into the voids, and to provide sufficient precursor to coat the high surface are of these materials. Similarly, shorter exposure times and lower precursor pressures can be used to coat dense, essentially planar collector surfaces made of metal or dense polymers.

In some embodiments, the base material can be heated to a predetermined temperature during the ALD, MLD, and/or SIS process. For example, the first predetermined temperature can be in the range of 50-450 degrees Celsius (e.g., 50, 60, 70, 80, 90, 100, 110, 120, 130, 140, 150, 160, 170, 180, 190, 200, 250, 300, 300, 350, 400, or 450 degrees Celsius inclusive of all ranges and values therebetween). In some embodiments, the predetermined temperature is in the range of 70-90 degrees Celsius, for example 85 degrees Celsius. In some embodiments, the first predetermined temperature can be in the range of 190-210 degrees Celsius, for example 200 degrees Celsius. Lower temperatures, below 220 degrees Celsius, are more suitable for polymer collector materials such as foams that may have a low melting point or glass transition temperature. Higher deposition temperatures, above 250 degrees Celsius, may be more suiltable for metal substrates as they tend to give more dense films.

In some embodiments, the first metal precursor includes Trimethyl Aluminum (TMA), Triethyl Aluminum (TEA), Yttrium Tris(2,2,6,6-Tetramethyl-3,5-Heptanedionate) ($Y(thd)_3$), Diethyl Zinc (DEZ), Titanium tetrachloride ($TiCl_4$), Vanadium (V) Oxytriisopropoxide (VOTP), Palladium (II) hexafluoroacetylacetonate, ($Pd(hfac)_2$), copper bis (2,2,6,6-tetramethy 1-3, 5-heptanedionate) ($Cu(thd)_2$), copper(II) hexafluoroacetylacetonate hydrate ($Cu(hfac)_2$), iron tris(2,2,6,6-tetramethyl-3,5-heptanedionate) ($Fe(thd)_3$), cobalt tris(2,2,6,6-tetramethyl-3,5-heptanedionate) ($Co(thd)_3$), Bis(2,2,6,6-tetramethyl-3,5-heptanedionato), barium triglyme adduct (Ba(thd)2.tri), Bis(cyclopentadienyl) ruthenium (Ru(cp)2), disilane ($Si_2H_6$), Tungsten Hexafluoride ($WF_6$), Bis(N,N'diisopropylacetamidinato) copper(I) (Cu(DIA)), Nickel (II) acetylacetonate (Ni(acac) 2), antimony pentachloride ($SbCl_5$), niobium pentachloride ($NbCl_5$), niobium pentethoxide ($Nb(OEt)_5$), titanium isopropoxide ($Ti(iOPr)_4$), tris(tetramethylcyclopentadienyl) cerium (III), cyclopentadienyl indium (InCp), tris(i-propyl-cyclopentadienyl) lanthanum ($La(iPrCp)_3$), bis(cyclopentadienyl) magnesium ($Mg(Cp)_2$), bis(cyclopentadienyl) nickel ($NiCp_2$), (trimethyl)methylcyclopentadienylplatinum (IV) ($Pt(MeCp)Me_3$), bis (pentamethylcyclopentadienyl) strontium ($Sr(Me5Cp)_2$), tris (cyclopentadienyl) yttrium ($YCp_3$), bis(cyclopentadienyl) dimethylzirconium ($ZrCp2Me_2$), bis (methylcyclopentadienyl) methoxymethyl zirconium (ZrOMe), tetrakis(dimethylamino) tin (TDMASn), tetrakis(dimethylamino) zirconium (TDMAZr), tris(dimethylamino) aluminum (TDMAAI), iridium(III) acetylacetonate (Ir(acac)$_3$), niobium pentafluoride (NbF$_5$), ferrocene (FeCp$_2$), cyclohexadiene iron tricarbonyl (FeHD(CO)$_3$), tetrakis(dimethylamino) antimony (TDMASb), aluminum trichloride (A$_1$Cl$_3$), niobium (V) iodide (NbI$_5$), tin (IV) iodide (SnI$_4$), Tris(tetramethylcyclopentadienyl) gadolinium (III) (Gd(Me$_4$Cp)$_3$), Bis(pentamethylcyclopentadienyl) barium 1,2-dimethoxyethane adduct (Ba(Me$_5$Cp)-2-DMA), Molybdenum Hexafluoride (MoF$_6$), Tris (tert-pentoxy)silanol (TTPSi), Silicon tetrachloride (SiC$_{14}$), lithium tert-butoxide (Li(tOBu)), trimethyl indium (TMin), trimethyl gallium (TMGa), and dimethyl cadmium (TMCd), or any combination thereof.

In some cases, the silane agent can be applied directly after the ALD metal precursor without using the intermediate co-reactant exposure. For instance, the Al$_2$O$_3$ ALD can be performed using some number of TMA/H$_2$O cycles, but ending with a TMA exposure so that the surface is terminated with Al—CH$_3$ groups. If the silane agent has functional groups, such as alcohol (C—OH), that react with the Al—CH$_3$ groups, then the silane agent can be dosed directly after the TMA.

The base material plus first co-reactant is then exposed to a second co-reactant precursor for a second predetermined time and a second partial pressure of the second co-reactant such that the second co-reactant precursor reacts with the first metal precursor to form the hydroxyl. In some embodiments, the second co-reactant precursor includes water, hydrogen peroxide, nitrous oxide, oxygen, ozone, hydrogen, formaldehyde, trimethyl aluminum, ammonia, hydrazine, dimethyl hydrazine, diethyl hydrazine, methyl-ethyl hydrazine, hydrogen sulfide, trimethyl phosphite, trimethyl phosphate, silane, disilane, or any combination thereof. For example, the first metal precursor can be trimethyl aluminum and the second co-reactant can be water. The second predetermined time can be in the range of 1 to 500 seconds (e.g., 1, 5, 10, 20, 30, 40, 50, 60, 70, 80, 90, 100, 120, 140, 160, 180, 200, 220, 240, 260, 280, 300, 350, 400, 450 or 500 seconds inclusive of all ranges and values therebetween). In some embodiments, the second predetermined time is in the range of 1 and 10 seconds, for example about 5 seconds. The second partial pressure of the second co-reactant can be in the range of 0.01 Torr to 10 Torr. (e.g., 0.01, 0.05, 0.1, 0.5, 1.0, 5.0, 10 Torr inclusive of all ranges and values therebetween). In some embodiments, the partial pressure of the second co-reactant is in the range of 0.1 Torr and 1 Torr, for example about 0.5 Torr.

Any number of cycles of exposing the coating to the first metal precursor and the second co-reactant precursor can be performed to reach a desired film thickness and density of bindings sites on the substrate. In some embodiments, the number of cycles of the ALD, MLD, and/or SIS process can be in the range of 1-500 cycles (e.g., 1 cycle, 2, 3, 4, 5, 10, 15, 20, 25, 30, 35, 40, 45 50, 100, 150, 200, 250, 300, 350, 400, 450, or 500 cycles inclusive of all ranges and values therebetween). In some embodiments, 1 to 5 cycles of the ALD, MLD, and/or SIS process are used to form a desired thickness of the inorganic material on the base material. Larger numbers of cycles are used for ALD, MLD, and/or SIS processes that have lower growth per cycle values, or to deposit thicker films of these materials. For instance, it may be advantageous to deposit a thicker coating on a metal collector to impart greater hardness, to change the surface roughness, or to impart corrosion resistance. Smaller number of ALD, MLD and/or SIS cycles are used for processes that have larger growth per cycle values, or for thin films such as the coatings on polymer foams where the intended purpose is solely to create a high density of functional groups for the silane agent.

In some embodiments, the inorganic material formed on the base material and deposited on or infiltrating at least the portion of the base material includes a metal, a metal oxide, a metal nitride, a metal sulfide, metal chalcogenide, a metal carbide, a metal phosphide, an organic-inorganic hybrid material such as a metalcone, or any combination thereof. For example, the inorganic material can include Al$_2$O$_3$, TiO$_2$, ZnO, MgO, SiO$_2$, HfO$_2$, ZrO$_2$, W, alucone, titanicone, or any combination thereof. In some embodiments, the first metal precursor includes TMA and the second co-reactant precursor includes water or ozone. In such embodiments, the inorganic material coated on and infiltrating at least a portion of the base material includes Al$_2$O$_3$.

Expanding further, SIS is related to ALD. MLD is similar to ALD but instead of atoms being deposited layer by layer as in ALD, molecules are deposited layer by layer on the substrate. In general, the SIS process involves exposing a substrate (e.g., the base material) which can be formed from an organic material to various gas phase precursors (e.g., the first metal precursor and the second co-reactant precursor) to synthesize the inorganic material, similar to ALD. However, contrary to ALD, which only forms the inorganic material on a surface of the substrate, SIS coats the surface of the substrate but also infiltrates into the bulk substrate. This is achieved by adjusting the partial pressure and time of the gas phase precursor exposures (i.e., the first metal precursor and the second co-reactant precursor).

In some embodiments, the SIS process may include relatively long periods of gas phase exposure and high partial pressure of the first metal precursor and the second co-reactant precursor. For example, the SIS method may include a relatively long period of gas phase exposure and high partial pressure of the first metal precursor followed by a long period of exposure and high partial pressure of the second co-reactant precursor. In various embodiments, a purging step can be performed in-between exposure to the first metal precursor and the second co-reactant precursor.

For example, the base material can be positioned in a hermetically sealed chamber pumped to vacuum. The base material is exposed to the first metal precursor for the first predetermined time (e.g., between 1 second and 500 seconds) and the first partial pressure (e.g., between 0.01 and 10 Torr). The chamber is then evacuated, and/or purged with an inert gas, for example nitrogen, argon, or any other inert gas before exposing the base material to the second co-reactant component. In another embodiment, the method may include a series of short pulses of the first metal precursor followed by another series of short pulses of the second co-reactant precursor. In some embodiments, a series of short pulses may be combined with long periods of gas phase exposure to the first metal precursor and/or the second co-reactant precursor.

In some embodiments, the total time of exposure to first metal precursor and/or the second co-reactant precursor during SIS cycle may be 5 to 1000 times higher and the partial pressures may be 5-10,000 larger than the typical time and partial pressure for an ALD cycle.

The first metal precursor selectively binds (either covalently or non-covalently) to the base material. The second co-reactant precursor is selectively reactive with the first metal precursor that is bound to the base material. For example, the first metal precursor gas may be a ligated metal such as trimethyl aluminum (TMA) and the second precursor gas may be water. In some embodiments, a third precursor may be used.

The SIS process results in the growth of the inorganic material on the surface of the base material and also in a sub-surface region of the base material associated with the first metal precursor and the second co-reactant precursor used. In some embodiments, the inorganic material can form an inorganic layer that may have a thickness in the range of 0.2 nm to 5,000 nm. For example, the inorganic material can include aluminum oxide ($Al_2O_3$), which may be formed on the base material surface using TMA as the first metal precursor and water as the second co-reactant precursor. In other embodiments, the inorganic material can infiltrate the base material via SIS so as to infuse the base material polymer with the inorganic material (e.g., $Al_2O_3$) to a depth of 0.05 micron to 1,000 microns.

In various embodiments, the second co-reactant precursor may be an oxygen source (e.g., $H_2O$, $O_2$, $O_3$, $H_2O_2$, etc.), a reducing agent (e.g., $H_2$, hydrazine, $Si_2H_6$, etc.), or other compound reactive with the first metal precursor. The order of the precursors may be altered in various embodiments. For instance, in some embodiments the second co-reactant precursor (e.g., $H_2O$, $H_2S$) can be selected to react with or bind to a specific functional group in the base material and utilized first in the ALD, MLD, and/or SIS sequence, and the first metal precursor can be utilized next in the ALD, MLD, and/or SIS sequence so as to react with the adsorbed or bound second co-reactant precursor.

The inorganic material is functionalized with an oleophilic material at 106, thereby forming the oleophilic coating. The oleophilic material can include any material that has a high affinity for oils. In some embodiments, the oleophilic material can include a silane, for example, 3-(trimethoxysilyl)propylmethacrylate, heptadecafluorodecyltrimethoxysilane, octadecyldimethylchlorosilane, octadecyltrichlorosilane, tris(trimethylsiloxy)silylethyldimethylchlorosilane, octyldimethylchlorosilane, dimethyldichlorosilane, butyldimethylchlorosilane, trimethylchlorosilane, octadecyltrichlorosilane, methyltrimethoxysilane, nonafluorohexyltrimethoxysilane, vinyltriethoxysilane, ethyltrimethoxysilane, propyltrimethoxysilane, trifluoropropyltrimethoxysilane, 3-(2-aminoethyl)-aminopropyltrimethoxysilane, p-tolyltrimethoxysilane, cyanoethyltrimethoxysilane, aminopropyltriethoxysilane, phenyltrimethoxysilane, chloropropyltrimethoxysilane, mercaptopropyltrimethoxysilane, glycidoxypropyltrimethoxysilane, acetoxyethyltris(dimethylamino)silane, n-decyltris(dimethylamino)silane, 7-octenyltrimethoxysilane, 7-octenylthrichlorosilane, γ-methacryloxypropyltrimethoxysilane, (3-glycidyloxypropyl)trimethoxysilane, 3-(trimethoxysilyl)propyl acrylate, isooctyl trimethoxysilane, butyldimethyl(dimethylamino)silane, trimethoxy(7-octen-1-yl)silane, 3-(trichlorosilyl)propyl methacrylate, 2-(trichlorosilyl)ethyl acetate, (3-aminopropyl)triethoxysilane, any other silane, any other oleophilic material or any combination thereof.

The base material can be exposed to the oleophilic material using any suitable method. In some embodiments, the oleophilic material is deposited using a liquid phase method, for example by immersing the coating comprising the base material coated with the inorganic material in the liquid oleophilic material (e.g., a silane) or in a liquid solution of the oleophilic material dissolved in a solvent (e.g., ethanol). In some embodiments, the coating can be exposed to a vapor of the oleophilic material (e.g., a vapor of a volatile silane) or in a gaseous mixture containing the volatile silane (e.g., a gaseous mixture of an inert gas such as argon and a vapor of a volatile silane). For example, the coating coated with or infiltrated with the inorganic material can be functionalized with the oleophilic material using a single-step vapor phase process.

In some embodiments, an ALD process can be used to coat the coating with the oleophilic material. For example, the coating including the base material (e.g., polyurethane) coated with an inorganic material (e.g., $Al_2O_3$) is subjected to one or more ALD cycles comprised of an exposure to the oleophilic material (e.g., 3-(trimethoxysilyl)propylmethacrylate) optionally followed by an exposure to a co-reactant (e.g., water). The oleophilic material, for example a silane, can covalently or non-covalently react with the inorganic material, for example a metal or metal oxide, so that the inorganic material is functionalized with the oleophilic material. In this manner, an oleophilic coating having a high capacity and affinity for oils and low affinity for water is formed.

In some embodiments, the ALD coating can be an inorganic material (such as $TiO_2$, $SnO_2$ or $Ta_2O_5$) that is known to impart a higher corrosion resistance to the base material compared to $Al_2O_3$. This may be useful in cases where the oil must be removed from water having a high acidity or basicity that would dissolve the base material or the ALD $Al_2O_3$. Additional corrosion resistance may be imparted by growing an ALD multilayer such as $TiO_2/Al_2O_3/TiO_2/Al_2O_3$ where the individual ALD $TiO_2$ or $Al_2O_3$ layers may be 10-100 nm in thickness. $SnO_2$ or $Ta_2O_5$ may be preferable to $TiO_2$ in cases where the skimmer is exposed to ultraviolet (UV) light such as bright sunlight. In these cases, the photoactivity of the $TiO_2$ may degrade or break down the organic silane molecule that imparts the oleophilic properties.

It is know that ridges, fins, or grooves machined or molded into the skimmer surface can dramatically improve the oil recovery rate compared to a flat surface. In such cases, it would be challenging to coat these non-planar, high-aspect ratio skimmer surfaces with an oleophilic coating. However, ALD, MLD and SIS are extremely conformal thin film deposition processes that can coat non-planar, high-aspect ratio substrates with excellent uniformity and conformality. One aspect of our invention is to deposit oleophilic coating onto skimmer surfaces bearing ridges, fins, or grooves using the methods discussed above.

Figure 5:
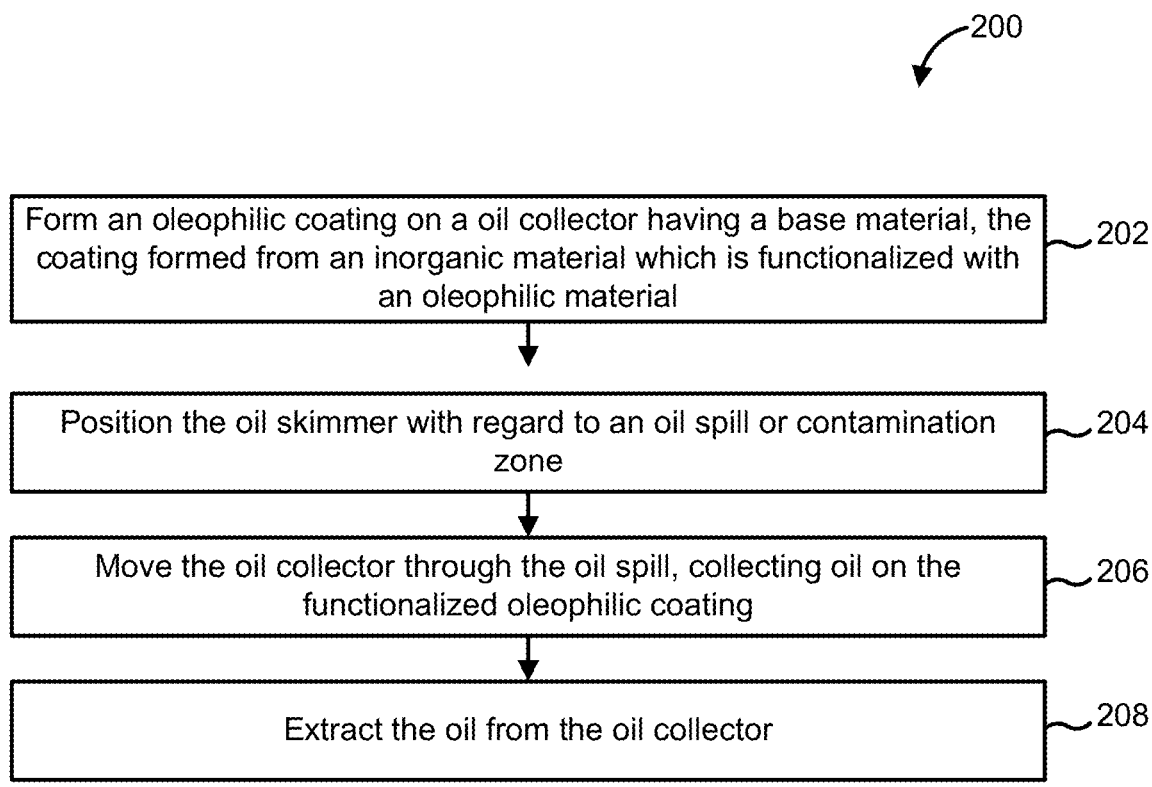
FIG. 5 is a schematic flow diagram of a method for fabricating an oleophilic coating, according to an embodiment.

FIG. 5 is a schematic flow diagram of an embodiment of a method 200 for cleaning and recovering oil from oil spills located on or beneath the surface of a water body, for example an ocean, a lake or a river. The method 200 forms the oleophilic coating. The oleophilic coating comprises a base material of the skimmer. The base material is coated with an inorganic material, for example $Al_2O_3$ or any other inorganic material described herein which is deposited on or infiltrates the base material. The inorganic material can be coated on the base material using the ALD, MLD, and/or SIS process described herein and using any first metal precursor (e.g., TMA) and second co-reactant precursor (e.g., water) as described in detail with respect to the method 100. The inorganic material is functionalized with an oleophilic material, for example a silane or any other oleophilic material described in detail herein.

In some embodiments, the skimmer 800 having the oleophilic coating 810 is positioned with regard to an oil spill at 204. There is relative movement of the coating and the water body corresponding to a location of the oil spill at 206. The oleophilic material included in the oleophilic coating causes the oleophilic coating to reversibly absorb the oil.

As used herein, the singular forms "a," "an," and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present disclosure.

While this specification contains many specific implementation details, these should not be construed as limitations on the scope of any embodiments or of what may be claimed, but rather as descriptions of features specific to particular implementations of particular embodiments. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the disclosure have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An oil skimmer comprising:
   a polymer foam oil collector having an oleophilic coating, the oleophilic coating comprising a corrosion resistant inorganic material with a bound silane compound, the corrosion resistant material comprising $SnO_2$ or $Ta_2O_5$;
   an oil collector retriever, operably connected to the polymer foam oil collector for movement of the polymer foam oil collector;
   an oil extractor positioned in operative contact with at least a portion of the foam oil collector, the oil extractor having a first set of rollers configured to compress the polymer foam oil collector a first distance and a second set of rollers configured to compress the polymer foam oil collector a second distance, the first distance being less than the second distance wherein engagement of the polymer foam oil collector with the first set of rollers extracts water and wherein the engagement of the polymer foam oil collector with the second set of rollers extracts oil;
   the oil collector retriever configured to position the portion of the foam oil collector in communication with the oil extractor, wherein the oil extractor is configured to extract oil from the oleophilic coating into an associated oil storage; and
   a storage vessel for receiving the extracted oil.

2. The oil skimmer of claim 1, wherein the oleophilic coating is functionalized with a material selected from the group consisting of: 3-(trimethoxysilyl)propylmethacrylate, heptadecafluorodecyltrimethoxysilane, octadecyldimethylchlorosilane, octadecyltrichlorosilane, tris(trimethylsiloxy)silylethyldimethylchlorosilane, octyldimethylchlorosilane, dimethyldichlorosilane, butyldimethylchlorosilane, trimethylchlorosilane, octadecyltrichlorosilane, methyltrimethoxysilane, nonafluorohexyltrimethoxysilane, vinyltriethoxysilane, ethyltrimethoxysilane, propyltrimethoxysilane, trifluoropropyltrimethoxysilane, 3-(2-aminoethyl)-aminopropyltrimethoxysilane, p-tolyltrimethoxysilane, cyanoethyltrimethoxysilane, aminopropyltriethoxysilane, phenyltrimethoxysilane, chloropropyltrimethoxysilane, mercaptopropyltrimethoxysilane, glycidoxypropyltrimethoxysilane, acetoxyethyltris(dimethylamino)silane, n-decyltris(dimethylamino)silane, 7-octenyltrimethoxysilane, 7-octenylthrichlorosilane, y-methacryloxypropyltrimethoxysilane, (3-glycidyloxypropyl)trimethoxysilane, 3-(trimethoxysilyl)propyl acrylate, isooctyl trimethoxysilane, butyldimethyl(dimethylamino)silane, trimethoxy(7-octen-1-yl)silane, 3-(trichlorosilyl)propyl methacrylate, 2-(trichlorosilyl)ethyl acetate, and (3-aminopropyl)triethoxysilane.

3. The oil skimmer of claim 2, wherein the oleophilic coating has a density of functional groups of at least a monolayer.

4. The oil skimmer of claim 1, wherein a substrate of the oil collector comprises a flexible material.

5. The oil skimmer of claim 1, wherein the oleophilic coating comprises an inorganic material with the silane bound thereto.

6. The oil skimmer of claim 5, wherein the inorganic material is selected from the group consisting of $Al_2O_3$, $Ta_2O_5$, $TiO_2$, ZnO, MgO, $SiO_2$, $HfO_2$, $ZrO_2$, W, alucone, titanicone, and combinations thereof.

7. An oil skimmer comprising:
   an oil collector having an oleophilic coating on a base substrate, the oleophilic coating comprising a corrosion resistant inorganic material with a bound silane compound, the corrosion resistant material comprising $SnO_2$ or $Ta_2O_5$;

an oil collector retriever, operably connected to the oil collector for movement of the oil collector;

an oil extractor positioned in operative contact with at least a portion of the oil collector, the oil collector retriever configured to position the portion of the oil collector in communication with the oil extractor, wherein the oil extractor is configured to extract oil from the oleophilic coating; and a storage vessel for receiving the extracted oil.

* * * * *